United States Patent [19]
Jones et al.

[11] Patent Number: 5,519,585
[45] Date of Patent: May 21, 1996

[54] SANDWICHED INSULATIVE/CONDUCTIVE LAYER EMI SHIELD STRUCTURE FOR PRINTED CIRCUIT BOARD

[75] Inventors: Pearce R. Jones; David Lunsford, both of Austin, Tex.

[73] Assignee: Dell USA, L.P., Austin, Tex.

[21] Appl. No.: 391,828

[22] Filed: Feb. 21, 1995

Related U.S. Application Data

[63] Continuation of Ser. No. 46,066, Apr. 12, 1993, abandoned.

[51] Int. Cl.$^6$ .................................................. H05K 5/00
[52] U.S. Cl. ............... 361/818; 174/35 R; 174/35 MS; 174/51; 361/753; 361/755; 361/816
[58] Field of Search ........................... 174/35 R, 35 GC, 174/35 MS, 35 TS, 51; 206/275; 220/402; 235/488, 489, 490, 492; 257/728, 659; 307/89, 91; 361/753, 759, 800, 814, 816, 818, 212, 220, 684, 685; 439/607, 608, 609

[56] References Cited

U.S. PATENT DOCUMENTS

| | | | |
|---|---|---|---|
| 2,570,440 | 10/1951 | Freiberg | 361/818 |
| 4,754,101 | 6/1988 | Stickney et al. | 174/35 R |
| 4,889,959 | 12/1989 | Taylor et al. | 174/35 GC |
| 5,005,106 | 4/1991 | Kiku | 361/818 |
| 5,166,864 | 11/1992 | Chitwood et al. | 361/818 |
| 5,251,096 | 10/1993 | Hosoi et al. | 361/687 |

FOREIGN PATENT DOCUMENTS

| | | | |
|---|---|---|---|
| 0404155 | 12/1990 | European Pat. Off. | 361/818 |
| 0467521 | 1/1992 | European Pat. Off. | 361/818 |
| 63-288098 | 11/1988 | Japan | 174/35 R |
| 63-288097 | 11/1988 | Japan | 174/35 R |
| 3-276799 | 12/1991 | Japan | 361/818 |
| 4-26196 | 1/1992 | Japan | 361/818 |
| 4-58596 | 2/1992 | Japan | 361/818 |
| 4-87398 | 3/1992 | Japan | 361/818 |
| 4-123489 | 4/1992 | Japan | 174/35 R |
| 1088408 | 10/1967 | United Kingdom | 174/35 MS |
| 2254193 | 9/1992 | United Kingdom | 174/35 R |

*Primary Examiner*—Donald A. Sparks
*Attorney, Agent, or Firm*—Henry Garrana; Michelle Turner

[57] ABSTRACT

Using a thermal/vacuum forming process a thin film polymer substrate is shaped into a generally shroud-like EMI shield body which forms a portion of a multi-layer EMI shield structure removably secured to a side of a printed circuit board disposed within a plastic computer housing, over operating components disposed on the circuit board. An inner side of the polymer substrate body, which faces the operating components, has a metallic conductive layer formed thereon which, in turn, is covered by a layer of insulative material. During the application of the insulative material to the conductive layer, spaced, coplanar attachment portions of the metal clad shield body are masked on their inner sides so that in the finished EMI shield structure the conductive material on these attachment portions is exposed. When the attachment portions of the EMI shield structure are screwed to the component side of the circuit board with metal fasteners the conductive layer of the shield is conductively communicated with the internal ground plane of the printed circuit board via the metal fasteners. By connecting the EMI shield structure to the circuit board in this manner, the necessity of forming a metallic coating on the plastic computer housing, to create the requisite EMI shielding on the computer, is advantageously eliminated.

8 Claims, 3 Drawing Sheets

SANDWICHED INSULATIVE/CONDUCTIVE LAYER EMI SHIELD STRUCTURE FOR PRINTED CIRCUIT BOARD

This is a continuation of application Ser. No. 08/046,066, filed Apr. 12, 1993 now abandoned.

BACKGROUND OF THE INVENTION

The present invention generally relates to computer apparatus, and, in a preferred embodiment thereof, more particularly relates to the EMI/RFI shielding of personal computers.

Various operating components of a personal computer, such as its central processing unit, memory structures and the like, are typically mounted on a side of a printed circuit board supported in the plastic housing of the computer in a spaced, parallel relationship with an exterior wall of the housing, with the components facing the interior side surface of the housing wall. Since this plastic wall is essentially transparent to EMI/RFI radiation generated by the components during computer operation, it is necessary to incorporate some type of EMI shielding into the computer to at least minimize, if not completely eliminate, the generation of EMI/RFI radiation outwardly through the computer housing.

This requisite EMI shielding of the computer has conventionally been accomplished by coating the computer housing with a metallic material which reflects the generated EMI/RFI radiation and traps it in the housing. One conventionally utilized method of metallically coating the housing is to electrochemically cover it with, for example, a nickel-based coating. Another conventionally utilized method is to paint the housing with, for example, a copper-based paint.

While at first glance these and other conventional methods of forming an EMI shielding structure directly on the plastic computer housing appear to be relatively simple, straightforward solutions to the shielding requirement, they are subject to several well known problems, limitations and disadvantages. For example, the metallic coating of the plastic computer housing materially increases the overall fabrication cost of the computer. Moreover, the metallic coating is susceptible to being scratched or otherwise marred during the fabrication process. When this occurs it is typically necessary to scrap the housing portion which has been scratched or marred. Additionally, while the metallic coating of the housing substantially prevents outward transmission of EMI/RFI radiation through the housing walls, it does not materially inhibit such outward generation through the various housing joints and openings necessarily present in the housing.

In view of the foregoing it can readily be seen that a need exists for improved apparatus and methods for providing EMI/RFI shielding for a computer. It is accordingly an object of the present invention to provide such improved apparatus and methods.

SUMMARY OF THE INVENTION

In carrying out principles of the present invention, in accordance with a preferred embodiment thereof, a specially designed EMI shield structure is disposed within a plastic computer housing and functions to substantially prevent outward transmission through the housing of EMI radiation generated by electrical operating components mounted on a side surface of a printed circuit board supported within the housing. The use of the EMI shield uniquely eliminates the conventional need to coat the plastic housing with a metallic material to block outward transmission therethrough of such EMI radiation generated within the housing. While the EMI shield is representatively disclosed in conjunction with computer apparatus, it could also be used to advantage with other electronic apparatus in which a printed circuit board is disposed in a housing.

Representatively, the printed circuit board side surface upon which the electrical operating components are mounted, and project outwardly from, is in a spaced apart, parallel and facing relationship with an exterior wall of the housing. The EMI shield structure is interposed between the exterior housing wall and the printed circuit board side surface, is removably secured to such side surface, and covers the electrical operating components in a shroud-like manner.

In a preferred embodiment thereof the EMI shield is a multi-layer structure that includes a thin film polymer substrate body. Using a thermal/vacuum forming process a first portion of the substrate body is laterally deformed relative to a second portion thereof. The laterally deformed first portion of the substrate body forms thereon a depressed pocket area configured to receive the electrical operating components, while the second portion of the substrate body serves as an attachment portion thereof that may be removably secured to the component side surface of the printed circuit board. The laterally deformed substrate has an inner side surface which extends into the pocket area, and across the substrate attachment portion, and faces the component side of the circuit board when the EMI shield is operatively secured thereto.

A layer of metallic material is deposited on the inner substrate side surface, preferably by an electrostatic sputtering process, and a layer of insulative material, preferably a sprayed-on layer of acrylic insulator material, is deposited on the outer side surface of the metallic layer. During the deposition of the insulative layer portions of the metallic layer on the attachment portion of the substrate are masked so that in the finished shield the metallic layer is exposed on the attachment portion. The EMI shield is operatively and removably secured to the component side of the printed circuit board with metal fastening members, such as screws, which serve to conductively couple the ground plane of the circuit board to the metallic layer of the shield which thereby forms an outward extension of the ground plane that enshrouds the electrical operating components.

DETAILED DESCRIPTION

Figure 1:
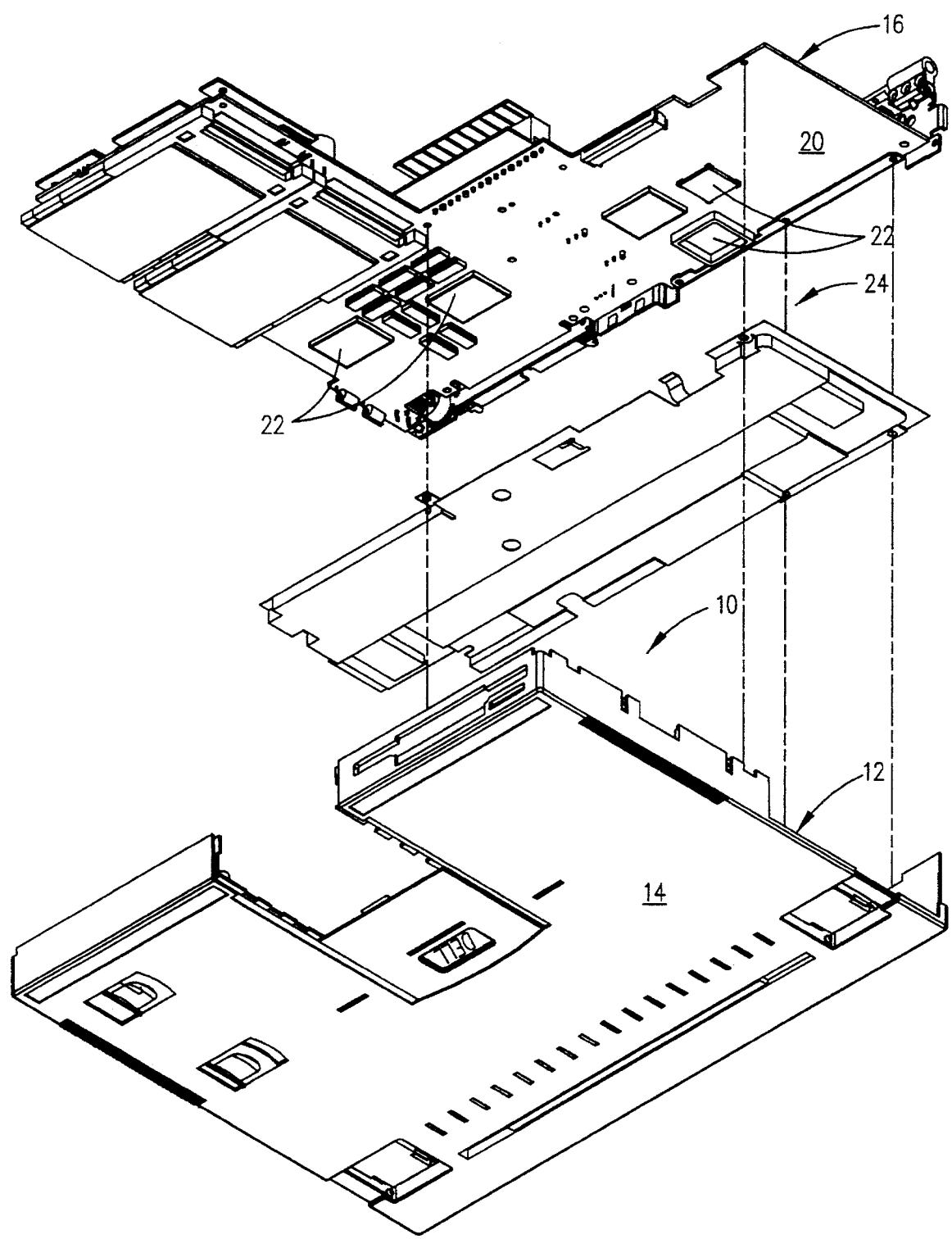
FIG. 1 is an exploded bottom side perspective view of a base portion of a representative portable computer having incorporated therein a thermal/vacuum formed thin film EMI shield embodying principles of the present invention and shown in simplified form.
Figure 2:
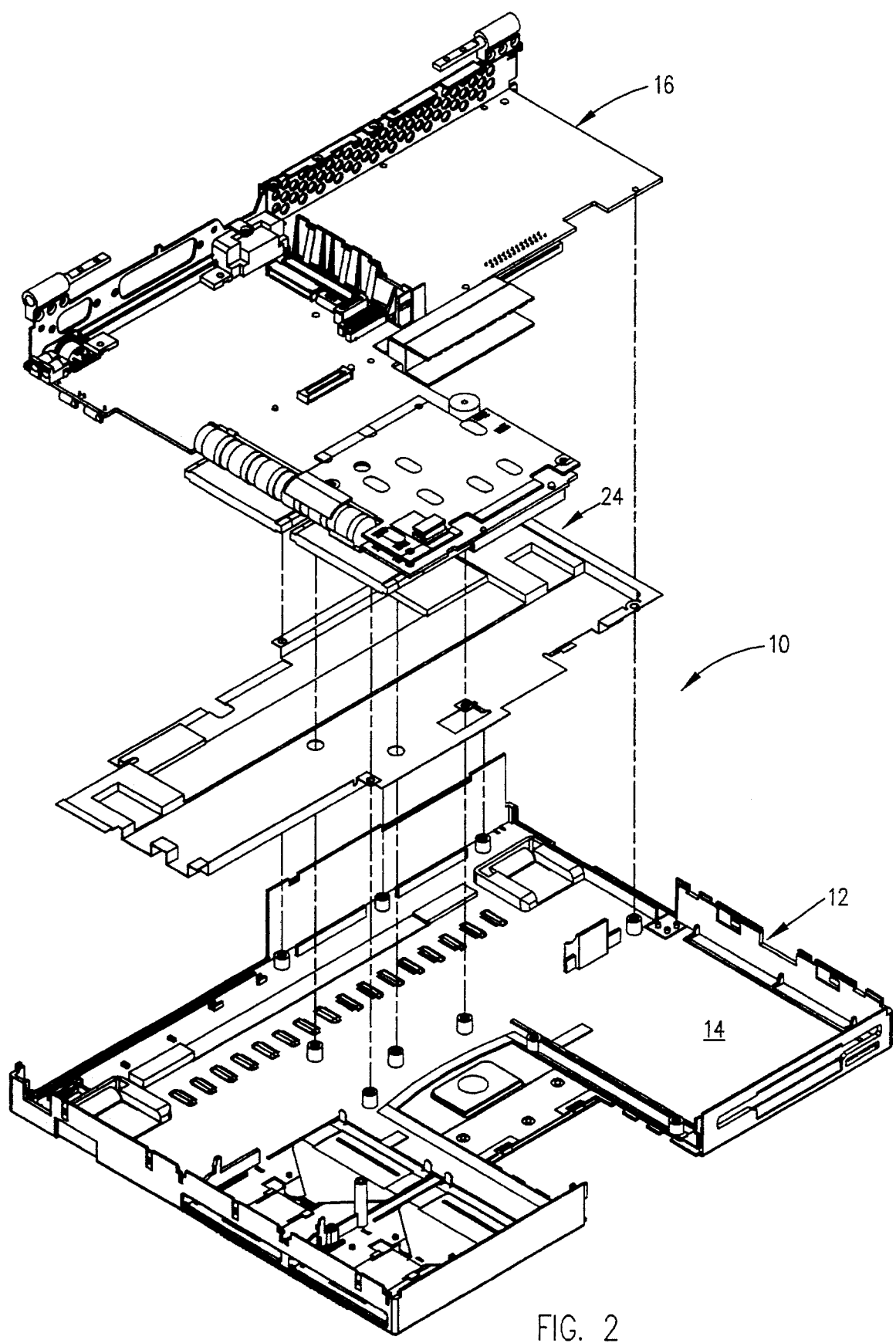
FIG. 2 is an exploded top side perspective view of the computer base portion shown in FIG. 1.
Figure 5:
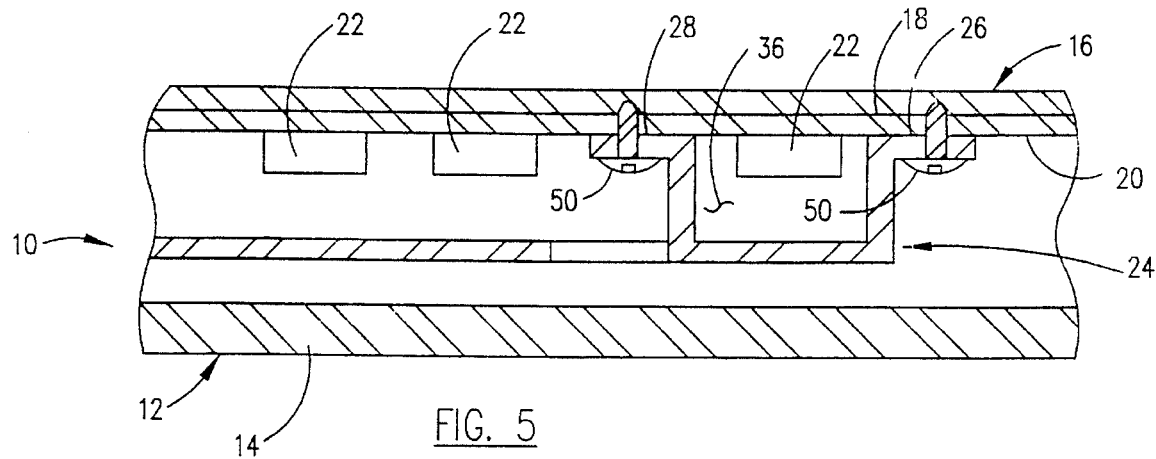
FIG. 5 is an enlarged scale, highly schematic cross-sectional view through the computer base portion in an assembled state.

Perspectively illustrated in FIGS. 1 and 2, in exploded form, is a bottom portion of a representative notebook computer 10 which includes a bottom plastic housing section 12 having a base wall 14. Removably supported within the housing section 12, in an upwardly spaced, parallel relationship with the base wall 14 (as schematically shown in FIG. 5), is a printed circuit board 16 having a ground plane 18 therein, a bottom side 20, and various operating components 22 mounted on bottom side 20. During operation of the computer 10 these operating components generate EMI/RFI radiation that must be prevented from passing outwardly through the computer housing, the plastic material of which is essentially "transparent" to such radiation.

The conventional method of substantially preventing the outward transmission of EMI radiation through the plastic computer housing is to coat the housing with a metallic layer which functions to reflect the radiation back into the housing. In the present invention the relatively expensive necessity of forming a metallic coating the housing, to form thereon an integral EMI shielding barrier, is eliminated by the use of a specially designed thermal/vacuum formed thin film EMI shield 24. In a manner subsequently described, the shield 24 is removably secured to the bottom side 20 of the printed circuit board 16 to cover the components 22 in a shroud-like manner and form a compact, highly effective EMI radiation barrier between the components 22 and the uncoated plastic bottom housing section 12.

Figure 3:
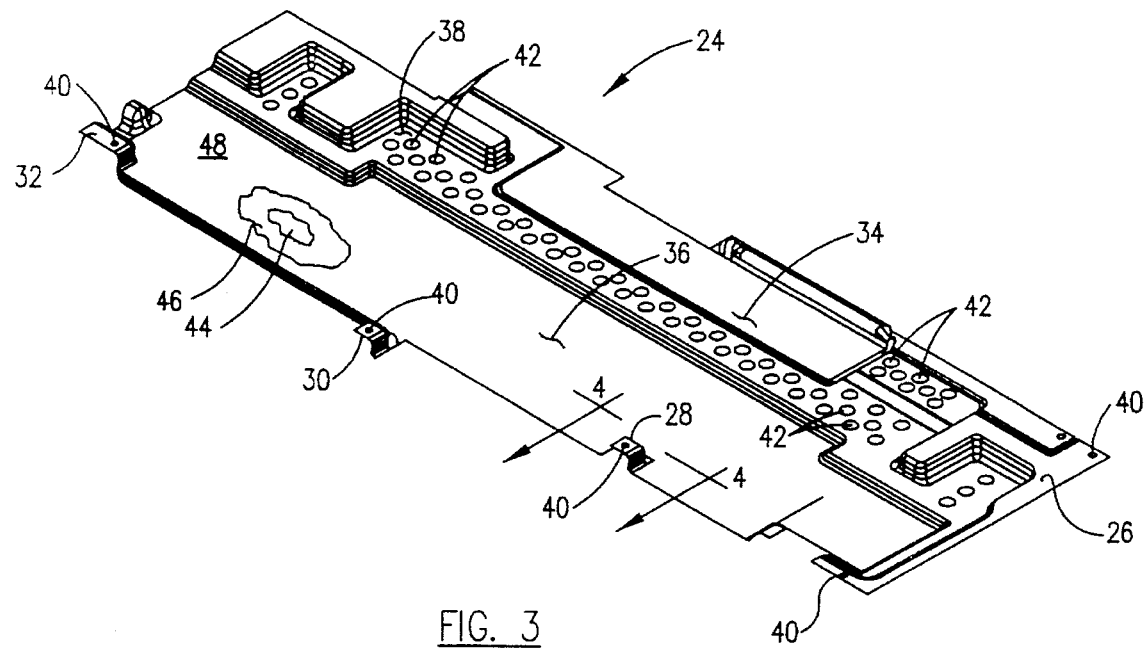
FIG. 3 is an enlarged scale top side perspective detail view of the EMI shield removed from the computer base portion.
Figure 4:
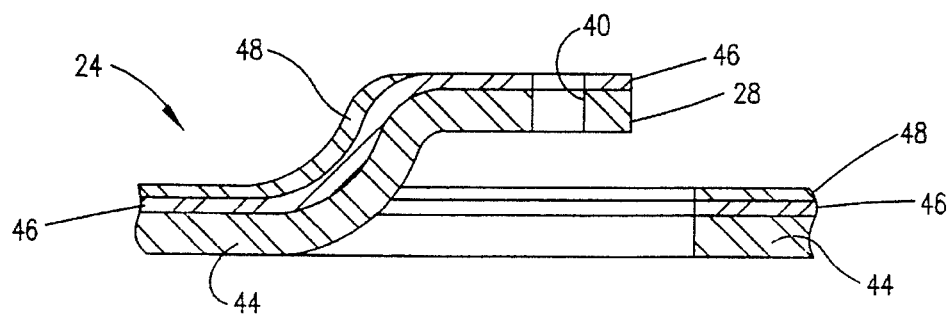
FIG. 4 is an enlarged scale partial cross-sectional view through the EMI shield taken along line 4—4 of FIG. 3.

Referring now to FIGS. 3–5, the EMI shield 24 of the present invention has a generally elongated rectangular configuration and has several attachment portions, such as the peripheral flange 26 and tabs 28–32 shown in FIG. 3, lying generally in a plane with one another. Downwardly offset from these shield attachment portions are various depressed areas 34–38 of the shield which, as schematically depicted in FIG. 5, form pockets that receive the components 22 when the shield 24 is operatively secured to the underside of the circuit board 16 as subsequently described. The attachment portions 26–32 have small circular mounting holes 40 therein, and a series of cooling openings 42 are formed in the body of the shield.

The EMI shield 24 has a thin film polymer substrate portion 44 which, using a thermal/vacuum process, is laterally deformed to the shield shape shown in FIG. 3. The top side of the substrate 44 is metallized, preferably by electrostatically sputtering a metallic coating 46 thereon. An insulative layer 48 is deposited atop the metallic coating 46 to prevent the circuit board components 22 from coming into contact with the coating 46. Representatively, the insulative layer 48 is a sprayed-on layer of acrylic insulator material.

Prior to the installation of the circuit board 16 within the bottom computer housing section 12 the EMI shield 24 is operatively secured to the bottom side 20 of the circuit board using metal mounting screws 50 extended upwardly through the attachment portion openings 40 into the body of the circuit board. Before the insulative layer 48 is applied to the metallic coating 46, the upper side surfaces of the attachment portions 26–32 are suitably masked to prevent the deposition of insulative material thereon. Accordingly, when the masking material is removed the top side surfaces of these attachment portions have exposed metallic areas which are pressed onto the underside of the circuit board when the screws 50 are secured thereto. In this manner, the overall body of metallic coating 46 is conductively coupled to the circuit board ground plane 18 (via the screws 50) and forms, in effect an extension thereof beneath the circuit board 16.

By relating the EMI shielding directly to the circuit board, using the thin film shield 24, instead of forming it on the plastic computer housing a variety of advantages are gained. For example, a substantial cost savings is achieved. Additionally, since the components 22 are closely shrouded at the circuit board, there is considerably less radiation leakage through the various joints and openings in the plastic computer housing. Moreover, since there is no longer a necessity of forming a scratch-prone metallic coating on the housing, the housing manufacturing rejection rate tends to be desirably reduced. The EMI shield 24 is extremely light in weight, may be relatively inexpensively manufactured, and may be easily and quickly installed on the underside of the printed circuit board 16.

The foregoing detailed description is to be clearly understood as being given by way of illustration and example only, the spirit and scope of the present invention being limited solely by the appended claims.

What is claimed is:

1. Electronic apparatus comprising: a housing having an exterior wall;

a printed circuit board supported in said housing in an inwardly spaced apart relationship with said exterior wall, said printed circuit board having a side facing said exterior wall and upon which a plurality of electrical components are operatively mounted, said printed circuit board having a ground plane therein; and an EMI shield structure interposed between said exterior housing wall and said printed circuit board side, secured to said side, and covering said electrical operating components in a shroud-like manner, said EMI shield structure being disposed entirely on said circuit board side, and being of a unitary, shape-retaining construction, said EMI shield structure including:

a thin insulative film substrate, said substrate having an attachment portion contiguous with said printed circuit board side, and a depressed portion laterally offset from said attachment portion, said depressed portion defining a pocket area that receives said electrical components, a layer of metallic material disposed on and covering all of a side surface of said substrate facing said side of said printed circuit board, said layer of metallic material contacting said attachment portion, and a plurality of openings extending through said EMI shield structure for allowing air to circulate between said plurality of electrical components, said electronic apparatus further comprising a layer of insulative material disposed on said layer of metallic material and interposed between said electrical components and said layer of metallic material, said layer of insulative material covering essentially all of said layer of metallic material except the portion thereof disposed on said attachment portion, said EMI shield structure being removably secured to said printed circuit board side by metal fastener members extending through said attachment portion into said printed circuit board and conductively coupling said ground plane and said layer of metallic material.

2. The electronic apparatus of claim 1 wherein:

said substrate is of a thin polymer film material.

3. The electronic apparatus of claim 2 wherein:

said substrate is a thermal/vacuum formed thin film polymer substrate.

4. The electronic apparatus of claim 1 wherein said electronic apparatus is a computer.

5. The electronic apparatus of claim 4 wherein said electronic apparatus is a portable computer.

6. The electronic apparatus of claim 5 wherein said electronic apparatus is a notebook computer.

7. Electronic apparatus comprising:

a printed circuit board having a first side upon which an outwardly projecting electrical component is operatively mounted, said printed circuit board further having a ground plane; and an EMI radiation shield structure positioned in its entirety on said first printed circuit board side, said EMI radiation shield structure having a unitary, shape-retaining construction and including:

a plastic film substrate body having a planar peripheral portion, and a hollow pocket portion disposed inwardly from said peripheral portion, transversely offset from the plane thereof, and receiving said electrical component, said substrate body having an interior side surface extending along the interior side of said hollow pocket portion and outwardly therefrom along a first side of said peripheral portion facing said first printed circuit board side, and an outer side surface extending along the exterior side of said hollow pocket portion and outwardly therefrom along the second side of said peripheral portion, said peripheral portion having spaced apart connection portions secured against said first printed circuit board side, a metallic coating covering all of said inner side surface of said substrate body and having an outer side surface, and an insulative coating covering all of said outer side surface of said metallic coating except the sections thereof disposed on said connection portions, and being interposed between said electrical component and said substrate body, whereby said sections of said metallic coating engage said first printed circuit board side, said EMI shield structure being removably secured to said printed circuit board side by metal fastener members extending through said attachment portions into said printed circuit board and conductively coupling said ground plane and said layer of metallic material.

8. The electronic apparatus of claim 7 wherein:

said plastic film substrate body is a thermally deformed vacuum molding.

* * * * *